(12) United States Patent
Kim et al.

(10) Patent No.: US 7,504,725 B2
(45) Date of Patent: Mar. 17, 2009

(54) SEMICONDUCTOR MEMORY DEVICE HAVING LOW-RESISTANCE TUNGSTEN LINE AND METHOD OF MANUFACTURING THE SEMICONDUCTOR MEMORY DEVICE

(75) Inventors: Rak-Hwan Kim, Gyeonggi-do (KR); Young-Cheon Kim, Gyeonggi-do (KR); Hyeon-Deok Lee, Seoul (KR); Hyun-Young Kim, Seoul (KR); In-Sun Park, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 581 days.

(21) Appl. No.: 10/915,871

(22) Filed: Aug. 9, 2004

(65) Prior Publication Data
US 2005/0042829 A1 Feb. 24, 2005

(30) Foreign Application Priority Data
Aug. 22, 2003 (KR) ...................... 10-2003-0058288

(51) Int. Cl.
*H01L 23/52* (2006.01)
(52) U.S. Cl. .............................. 257/751; 257/E21.658; 438/672
(58) Field of Classification Search ................. 257/263, 257/751, 764–771, 915, E21.627, E21.658; 438/643, 653, 672
See application file for complete search history.

(56) References Cited

U.S. PATENT DOCUMENTS

| | | | | |
|---|---|---|---|---|
| 5,008,216 A | * | 4/1991 | Huang et al. | 438/656 |
| 5,028,565 A | * | 7/1991 | Chang et al. | 438/654 |
| 5,049,975 A | * | 9/1991 | Ajika et al. | 257/764 |
| 5,312,775 A | * | 5/1994 | Fujii et al. | 438/625 |
| 5,523,259 A | * | 6/1996 | Merchant et al. | 438/643 |
| 5,552,339 A | * | 9/1996 | Hsieh | 438/643 |
| 5,565,708 A | * | 10/1996 | Ohsaki et al. | 257/764 |
| 5,668,411 A | * | 9/1997 | Hong et al. | 257/751 |
| 5,804,249 A | * | 9/1998 | Sukharev et al. | 438/669 |
| 5,847,420 A | * | 12/1998 | Kuge et al. | 257/207 |
| 5,963,828 A | * | 10/1999 | Allman et al. | 438/648 |
| 5,998,825 A | * | 12/1999 | Ochiai | 257/311 |

(Continued)

FOREIGN PATENT DOCUMENTS

KR      1998-060592      10/1998

OTHER PUBLICATIONS

English language abstract of Korean Publication No. 1998-060592.

*Primary Examiner*—Lex Malsawma
*Assistant Examiner*—William F Kraig
(74) *Attorney, Agent, or Firm*—Marger Johnson & McCollom, P.C.

(57) ABSTRACT

A semiconductor memory device and a method of manufacturing the semiconductor memory device, in which a bit line can have a low resistance without an increase in the thickness of the bit line. In the semiconductor memory device, an insulating layer having a contact hole that exposes a conductive region is formed on a semiconductor substrate having the conductive region. A barrier metal layer is formed along the surface of the insulating layer and the surface of the contact hole. A grain control layer is formed between the barrier metal layer and the tungsten layer. A tungsten layer is formed on the grain control layer. A grain size of the tungsten layer is increased by the grain control layer.

27 Claims, 7 Drawing Sheets

U.S. PATENT DOCUMENTS

| | | | |
|---|---|---|---|
| 6,001,415 A * | 12/1999 | Nogami et al. | 216/18 |
| 6,045,892 A * | 4/2000 | Lee et al. | 428/209 |
| 6,060,389 A * | 5/2000 | Brennan et al. | 438/643 |
| 6,087,259 A * | 7/2000 | Lee | 438/681 |
| 6,103,618 A * | 8/2000 | Abe | 438/637 |
| 6,140,223 A * | 10/2000 | Kim et al. | 438/629 |
| 6,146,998 A * | 11/2000 | Yamaha et al. | 438/653 |
| 6,163,047 A * | 12/2000 | Sung et al. | 257/306 |
| 6,211,090 B1 * | 4/2001 | Durlam et al. | 438/692 |
| 6,262,448 B1 * | 7/2001 | Enders et al. | 257/302 |
| 6,303,430 B1 * | 10/2001 | Jenq | 438/253 |
| 6,410,986 B1 * | 6/2002 | Merchant et al. | 257/763 |
| 6,413,853 B2 * | 7/2002 | Jang et al. | 438/627 |
| 6,455,419 B1 * | 9/2002 | Konecni et al. | 438/653 |
| 6,555,858 B1 * | 4/2003 | Jones et al. | 257/295 |
| 6,563,162 B2 | 5/2003 | Han et al. | |
| 6,635,965 B1 * | 10/2003 | Lee et al. | 257/758 |
| 6,750,098 B2 * | 6/2004 | Schlosser et al. | 438/244 |
| 6,787,461 B2 * | 9/2004 | Wang et al. | 438/672 |
| 7,138,337 B2 * | 11/2006 | Lin | 438/685 |
| 2001/0006241 A1 * | 7/2001 | Yang | 257/310 |
| 2001/0009807 A1 * | 7/2001 | Lai et al. | 438/653 |
| 2002/0022332 A1 * | 2/2002 | Arnal et al. | 438/386 |
| 2002/0135071 A1 * | 9/2002 | Kang et al. | 257/767 |
| 2002/0163063 A1 * | 11/2002 | Noguchi et al. | 257/666 |
| 2003/0111732 A1 * | 6/2003 | Goda et al. | 257/758 |

* cited by examiner

SEMICONDUCTOR MEMORY DEVICE HAVING LOW-RESISTANCE TUNGSTEN LINE AND METHOD OF MANUFACTURING THE SEMICONDUCTOR MEMORY DEVICE

CROSS REFERENCE TO RELATED APPLICATION

This application claims the priority of Korean Patent Application No. 2003-58288, filed on Aug. 22, 2003, in the Korean Intellectual Property Office, the disclosure of which is hereby incorporated by reference in its entirety.

BACKGROUND OF THE INVENTION

1. Field of the Invention

The present invention relates to a semiconductor memory device and a method of manufacturing the same, and more particularly, to a semiconductor memory device having a low-resistance tungsten line and to a method of manufacturing such a device.

2. Description of the Related Art

By improving the sensitivity of the sense amplifier used in dynamic random access memories (DRAMs), it is possible to more accurately sense and amplify the data stored in cells of the memory. The sensitivity can be improved by increasing the voltage difference, $\Delta V$, at the input of the sense amplifier. The difference voltage, $\Delta V$, is proportional to the supply voltage VCC, but is inversely proportional to the bit line loading capacitance ($C_b$).

The bit line loading capacitance includes the capacitance between the bit line and the substrate, the capacitance between the bit line and the word line, the capacitance between bit lines, and the capacitance between the bit line and a storage node contact plug. In particular, the capacitance between the bit line and the storage node contact plug has a great influence upon the bit line loading capacitance.

In order to reduce the capacitance between the bit line and the storage node contact plug, it is desirable to reduce the overlapping area between the bit line and the storage node contact plug. This can be accomplished by reducing the thickness of the bit line. However, reducing the thickness of the bit line increases the resistance of the bit line, resulting in a degradation of the operating speed of the semiconductor memory devices.

To reduce parasitic capacitance and to have a bit line with a small thickness, it has been suggested that a low-resistance metal layer be used as a bit line. Among such metal layers, a tungsten layer that is thermally stable and has a relatively low resistance has been frequently used as a bit line. A technique of forming a bit line of tungsten is disclosed in U.S. Pat. No. 6,563,162 granted to Han et al.

Hereinafter, such a bit line formed of tungsten will be briefly described with reference to FIG. 1. As shown in FIG. 1, an interlayer insulating layer 20 is formed on a semiconductor substrate 10 in which conductive regions, e.g., a MOS transistor (not shown) having a gate, a source, a drain and a contact pad (not shown) that contacts the source and drain of the MOS transistor, are formed. To expose the drain (not shown) of the MOS transistor or the contact pad that contacts the drain of the MOS transistor, the interlayer insulating layer 20 is etched to form a contact hole H.

A Ti layer 30 and a TiN layer 40 are formed on the interlayer insulating layer 20 and along the surface of the contact hole H. The Ti layer 30 and the TiN layer 40 can be formed using chemical vapor deposition (CVD). Using CVD they can be formed with a conformal thickness on the surface of the resultant structure of the etching. When depositing the Ti layer 30 and the TiN layer 40 using CVD, TiCl4 can be used as the source of Ti.

A tungsten (W)—nucleation layer is formed on the TiN layer 40, and then a bulk tungsten layer 50 is deposited on the tungsten (W)—nucleation layer. Predetermined parts of the bulk tungsten layer 50 and the tungsten (W)—nucleation layer are patterned. As a result, a bit line is formed.

As the capacity of semiconductor memory devices reaches up to 1 giga bits, the design rules of semiconductor memory devices drastically decrease. As a result smaller width bit lines are needed. When the width of bit lines is decreased, the resistance of the bit lines increases and the increase in resistance has an influence upon the operating speed of semiconductor memory devices.

Furthermore, if the thickness of a bit line is increased to reduce the resistance of the bit line, the capacitance of the bit line increases. Consequently, the sensitivity of the sense amplifier decreases. It is, in general, difficult to achieve a low-resistance bit line without increasing the capacitance of the bit line and therefore decreasing the sensitivity of the sense amplifier.

SUMMARY OF THE INVENTION

The present invention provides a semiconductor memory device having a tungsten bit line which has low capacitance and low resistance.

The present invention also provides a method of manufacturing a semiconductor memory device, with a narrow bit line which has low resistance.

According to the present invention, there is provided a semiconductor memory device and a method of making such a memory device. The device comprising a semiconductor substrate, an insulating layer, a barrier metal layer, and a tungsten layer. The semiconductor substrate has a conductive region. The insulating layer is formed on the semiconductor substrate and includes a contact hole that exposes the conductive region. The barrier metal layer is formed on the surface of the insulating layer and the surface of the contact hole. The tungsten layer is formed on the barrier metal layer to sufficiently fill in the contact hole. A grain control layer is interposed between the barrier metal layer and the tungsten layer. The grain size of the tungsten layer is controlled by the grain control layer. A contact plug is formed between the barrier metal layer of the contact hole and the grain control layer.

The amorphous conductive layer may have a thickness of about 50-200 Å, the nucleation layer may have a thickness of about 100-200 Å, and the bulk tungsten layer may have a thickness of about 400-500 Å.

BRIEF DESCRIPTION OF THE DRAWINGS

The above and other aspects and advantages of the present invention will become more apparent by describing in detail exemplary embodiments thereof with reference to the attached drawings in which.

DETAILED DESCRIPTION OF THE INVENTION

Figure 1:
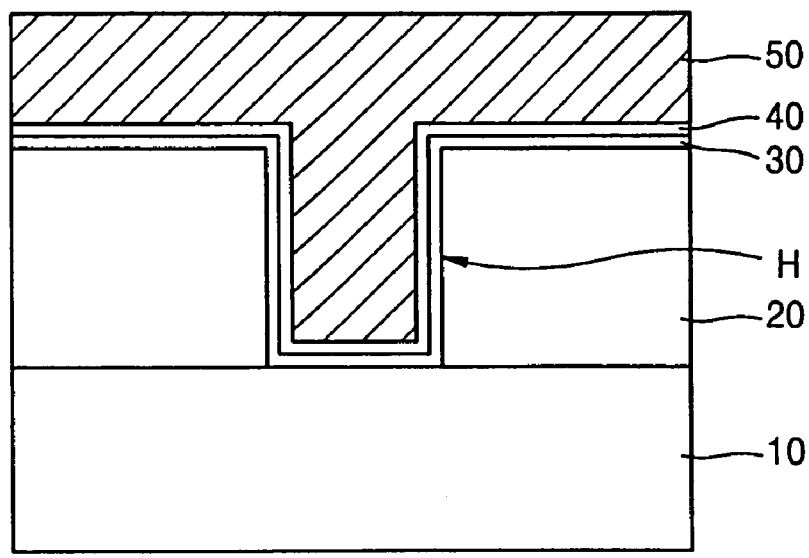
FIG. 1 is a cross-sectional view explaining a general method of manufacturing a tungsten bit line.

The present invention will now be described more fully with reference to the accompanying drawings, in which preferred embodiments of the invention are shown. This invention may, however, be embodied in many different forms and should not be construed as being limited to the embodiments set forth herein; rather, these embodiments are provided so that this disclosure will be thorough and complete, and will fully convey the concept of the invention to those skilled in the art. In the drawings, the shapes of elements are exaggerated for clarity and like reference numerals are used to refer to like elements throughout.

The resistance of a tungsten layer changes with the grain size of the tungsten layer. In other words, as the grain size increases, the resistance of the tungsten layer decreases. In particular, the grain size of the tungsten layer is dependent on the grain size of a nucleation layer of the tungsten layer, and the grain size of the nucleation layer is determined by the surface roughness of a lower layer of the nucleation layer. As the surface roughness of the lower layer gets lower, i.e., as the surface of the lower layer becomes smoother, the grain size of the nucleation layer increases. On the contrary, as the surface of the lower layer becomes rougher, the grain size of the nucleation layer decreases. In accordance with an embodiment of the present invention, a film having a smooth surface, e.g., an amorphous conductive layer is interposed between the tungsten layer and a barrier metal layer. At a stage where the amorphous conductive layer is interposed, if the nucleation layer of the tungsten layer is formed, the nucleation layer can have a relatively large grain size. As a result, the bulk tungsten layer also has a relatively large grain size. As such, it is possible to reduce the thickness of the tungsten layer without increasing the resistance.

Figure 2:
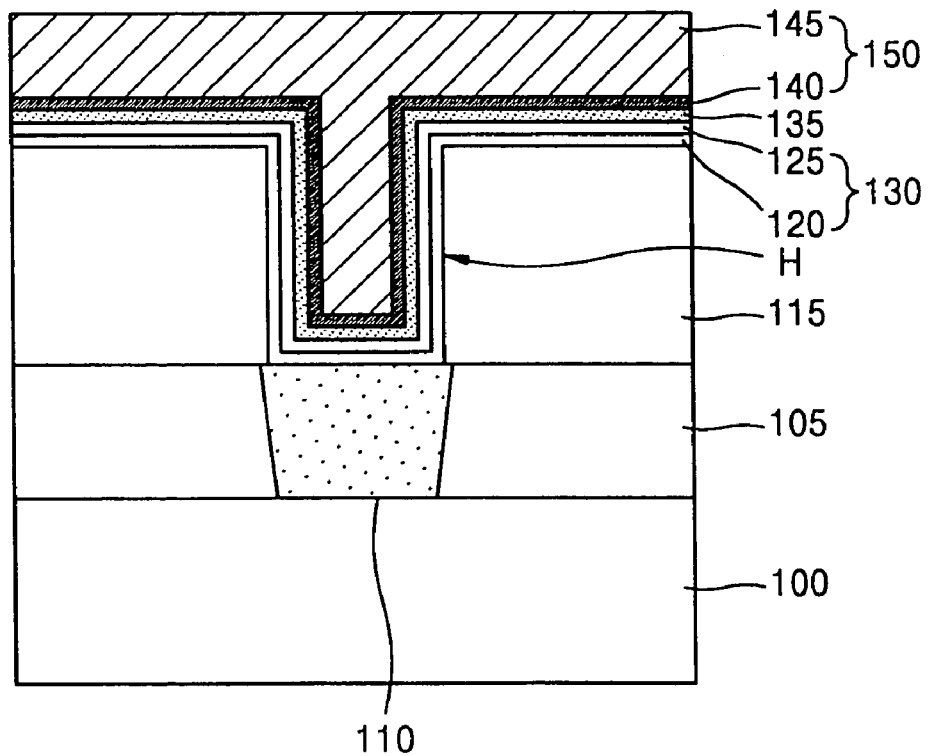
FIG. 2 is a cross-sectional view explaining a method of manufacturing a tungsten bit line according to a first embodiment of the present invention.

As shown in FIG. 2, a first interlayer insulating layer 105 having a contact pad 110 is formed on a semiconductor substrate 100. Although not shown in FIG. 2, a MOS transistor having a gate, a source, and a drain may be formed between the semiconductor substrate 100 and the first interlayer insulating layer 105 and the contact pad 110 is electrically connected to the drain of the MOS transistor. A second interlayer insulating layer 115 is deposited on the first interlayer insulating layer 105. A predetermined part of the second interlayer insulating layer 115 is etched to expose the contact pad 110. As a result, a contact hole H is formed.

A barrier metal layer 130 is formed on the surfaces of the second interlayer insulating layer 115 and within the contact hole H. Forming the barrier metal layer 130 includes sequentially depositing a Ti layer 120 and a TiN layer 125. The Ti layer 120 and the TiN layer 125 are formed using, for example, a chemical vapor deposition (CVD) process, so that they can be conformally deposited on the surfaces of the second interlayer insulating layer 115 and within the contact hole H. TiCl$_4$ gas may be used as a base gas to form the Ti layer 120 and the TiN layer 125. The Ti layer 120 and the TiN layer 125 may be deposited in-situ inside a CVD chamber.

A grain control layer 135 having a smooth surface is formed on the barrier metal layer 130. The grain control layer 135 may be a conductive layer that does not include a grain boundary at least on its surface such that its surface is smooth. For example, the grain control layer 135 may be an amorphous conductive layer having substantially no grain boundaries on its surface. A conductive layer formed using metal organic CVD (MOCVD), e.g., a TiN layer, a TaN layer, a WN layer, or an NbN layer, may be used as the amorphous conductive layer. In this embodiment, for example, a TiN layer formed using MOCVD is used as the grain control layer 135. Preferably, the TiN layer formed using MOCVD is deposited with a thickness of about 50-200 Å at a temperature of about 300-500° C., using a Tetrakis-dimethylamino titanium (TDMAT) source and an N$_2$ source gas that are supplied with a He gas. To remove carbon elements from the TDMAT source, the TiN layer formed using MOCVD may be formed in the following manner. A first layer of the grain control layer is formed on the barrier metal layer 130 to a first thickness. Then, a hydrogen (H$_2$) plasma process is performed on the first layer of the grain control layer 135 to reduce carbon. After that, a second layer of the grain control layer 135 is formed on the first layer of the grain control layer to a second thickness to form the grain control layer 135 having a whole thickness. The whole thickness is a combination of the first thickness and the second thickness. The H$_2$ plasma process is performed on the second layer of the grain control layer 135.

A thin silicon sacrificial layer (not shown) having a thickness of several Å may be deposited on the grain control layer 135. The silicon sacrificial layer is formed by supplying SiH$_4$ gas and is then naturally removed when a nucleation layer of a tungsten layer and a bulk tungsten layer are formed.

Figure 3:
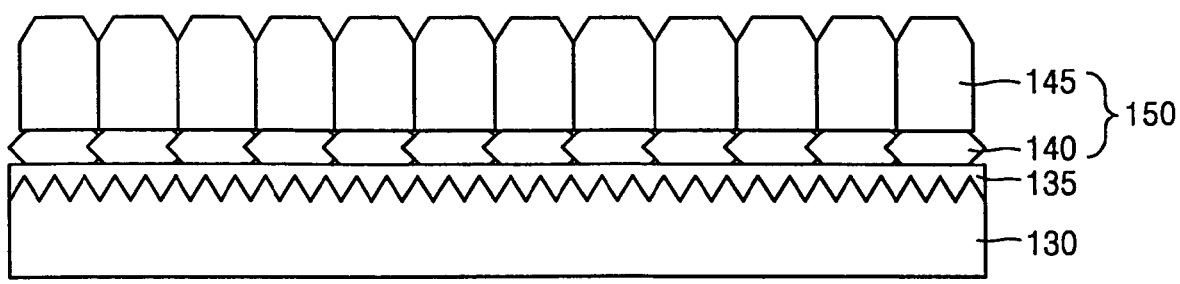
FIG. 3 is a cross-sectional view showing the grain sizes of a grain control layer, a nucleation layer, and a bulk tungsten layer, according to the first embodiment of the present invention.

A nucleation layer 140 is formed on the silicon sacrificial layer, for example, with a thickness of about 100-200 Å. The nucleation layer 140 is formed by supplying a WF$_6$ gas and an SiH$_4$ gas at a temperature of about 300-500° C., using CVD. A part of the silicon sacrificial layer is removed by F elements of a WF$_6$ gas supplied when the nucleation layer 140 is deposited. Here, as shown in FIG. 3, since the nucleation layer 140 is formed on the grain control layer 135 having a smooth surface, it has a relatively large grain.

A bulk tungsten layer 145 is formed on the nucleation layer 140, for example, to a thickness of about 400-500 Å. The bulk tungsten layer 145 is formed, for example, using a WF$_6$ gas and an H$_2$ gas as reaction gas at a temperature of about 300-500° C., using CVD. The remaining silicon sacrificial layer can be removed by F elements of a WF$_6$ gas that is supplied when the bulk tungsten layer 145 is formed. Here, the silicon sacrificial layer serves as a buffer that prevents the formed layers from being damaged by F elements of the WF$_6$ gas. Since this bulk tungsten 145 grows along grain boundaries of the nucleation layer 140 having a large grain as seeds, it also has a large grain, resulting in a decrease in the resistance of the bulk tungsten layer 145. Thereafter, predetermined portions of the bulk tungsten layer 145 and the nucleation layer 140 are patterned to form a bit line 150.

Figure 4A:
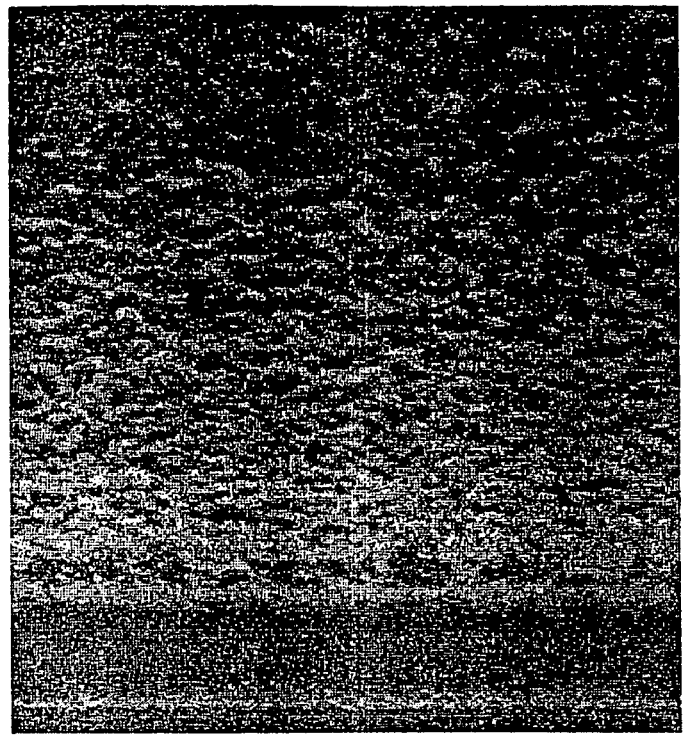
FIG. 4A is an SEM picture showing the surface of the grain control layer according to the first embodiment of the present invention.
Figure 4B:
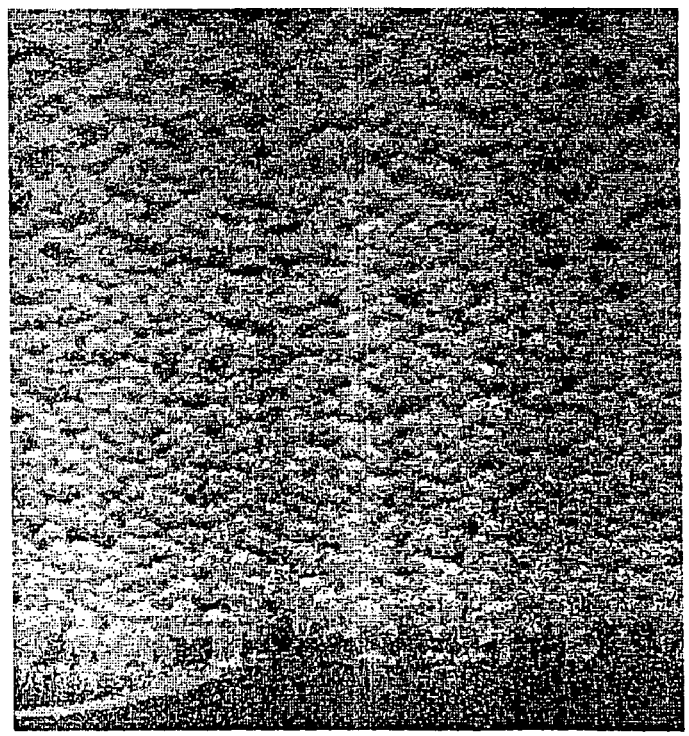
FIG. 4B is an SEM picture showing a TiN layer formed using TiCl4 gas using CVD according to the prior art.

FIG. 4A is an SEM picture showing the surface of the grain control layer 135 when a TiN layer formed using MOCVD is used as the grain control layer 135. FIG. 4B is an SEM picture showing a TiN layer formed using a TiCl$_4$ gas, using CVD. As shown in FIGS. 4A and 4B, it can be seen that the TiN layer formed using MOCVD according to this embodiment has a surface that is much smoother than that of the TiN layer formed using CVD.

Figure 5A:
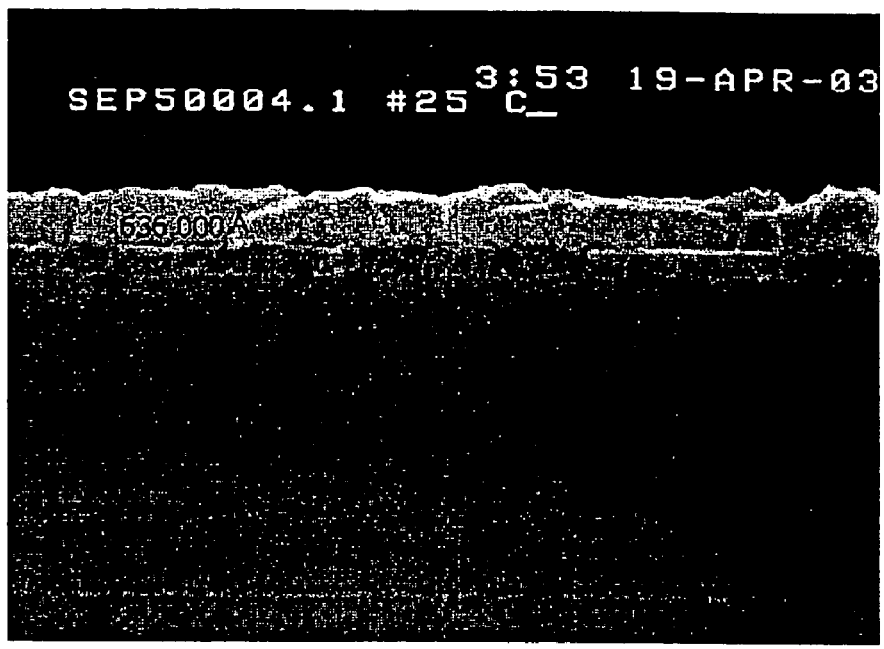
FIG. 5A is an SEM picture showing a structure where a tungsten layer is formed on the grain control layer, according to the first embodiment of the present invention.
Figure 5B:
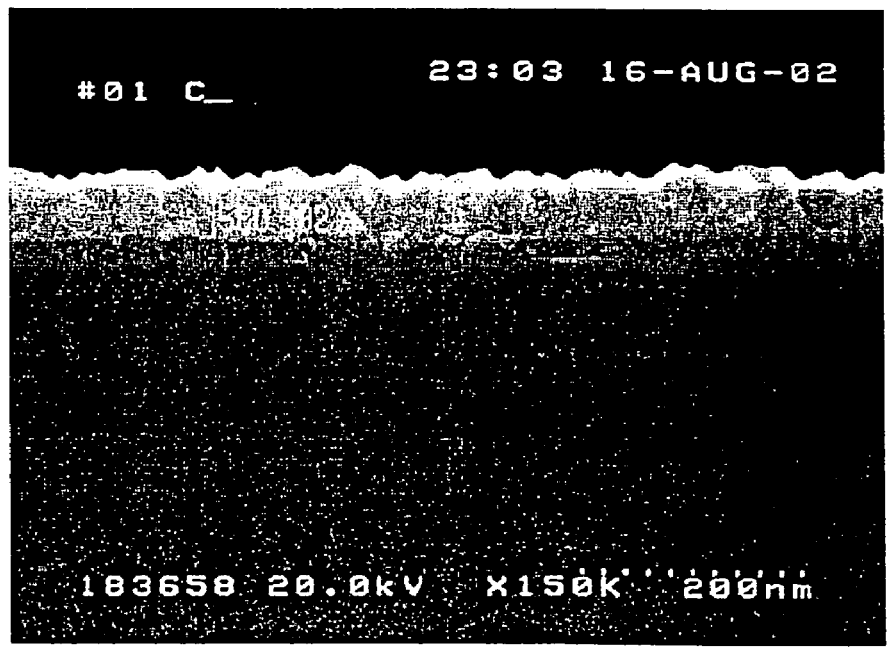
FIG. 5B is an SEM picture showing a structure where a tungsten layer is formed on a barrier metal layer according to the prior art.

FIG. 5A is an SEM picture showing a structure where a tungsten layer (the nucleation layer 140 and the bulk tungsten layer 145) is formed on the grain control layer 135 (a TiN layer formed using MOCVD), according to the first embodiment of the present invention. FIG. 5B is an SEM picture showing a structure where a tungsten layer is formed on a barrier metal layer (a Ti layer and/or a TiN layer formed using TiCl$_4$ gas, using CVD). As shown in FIGS. 5A and 5B, it can be seen that the tungsten layer formed on the grain control layer 135 (the TiN layer formed using MOCVD) having a smooth surface according to this embodiment has a grain that is larger than that of the tungsten layer of FIG. 5B.

Figure 6:
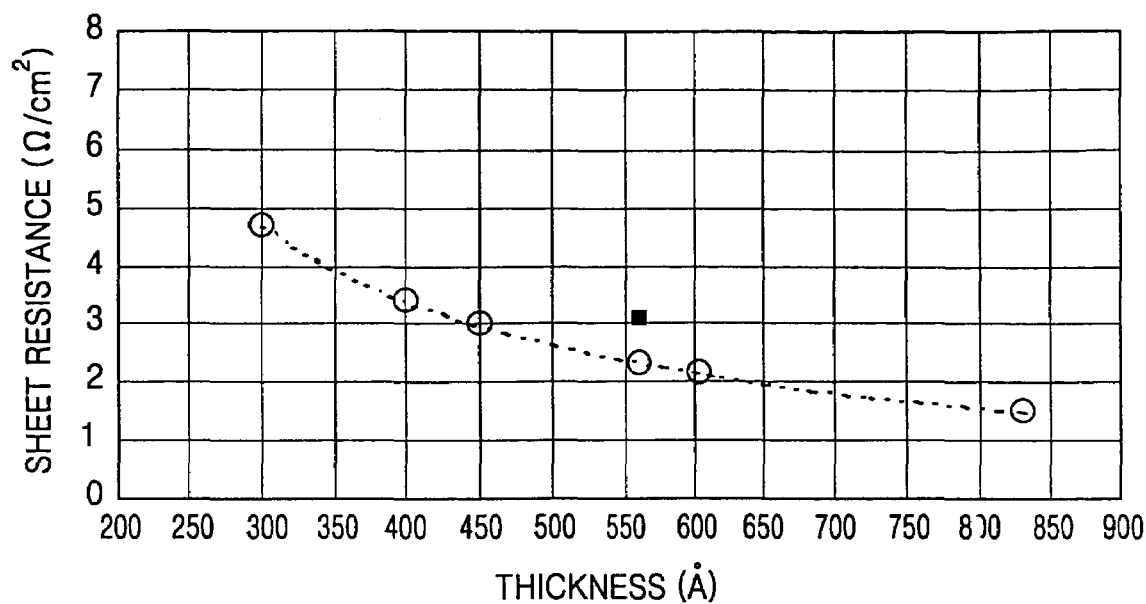
FIG. 6 is a graph showing the sheet resistance of a tungsten layer with respect to the thickness of the tungsten layer, where the tungsten layer is formed according to the first embodiment of the present invention.

Also, FIG. 6 is a graph showing the sheet resistance of a tungsten layer with respect to the thickness of the tungsten layer, where the tungsten layer is formed according to the first embodiment of the present invention. In the graph of FIG. 6, a symbol "o" represents the resistivity of the tungsten layer according to this embodiment and a symbol "■" represents the resistivity of a tungsten layer according to prior art. Referring to FIG. 6, according to this embodiment, when the tungsten layer 150 is deposited with a thickness of approximately 550 Å at the stage where the grain control layer 135 is interposed, the sheet resistance of the tungsten layer 150 is approximately 2.3 Ω/cm$^2$. In contrast, according to the prior art, when the tungsten layer is deposited on the barrier metal layer with a thickness of approximately 550 Å, the sheet resistance of the tungsten layer is more than approximately 3 Ω/cm$^2$. Meanwhile, in this embodiment, when the thickness of the tungsten layer 150 is 450 Å, the sheet resistance of the tungsten layer 150 is approximately 3 Ω/cm$^2$. In contrast, according to prior art, when the thickness of the tungsten layer is 550 Å, the sheet resistance of the tungsten layer is approximately 3 Ω/cm$^2$. In conclusion, this embodiment is superior in the sheet resistance characteristic, thus reducing the thickness of the tungsten layer when obtaining the same resistance.

Figure 7:
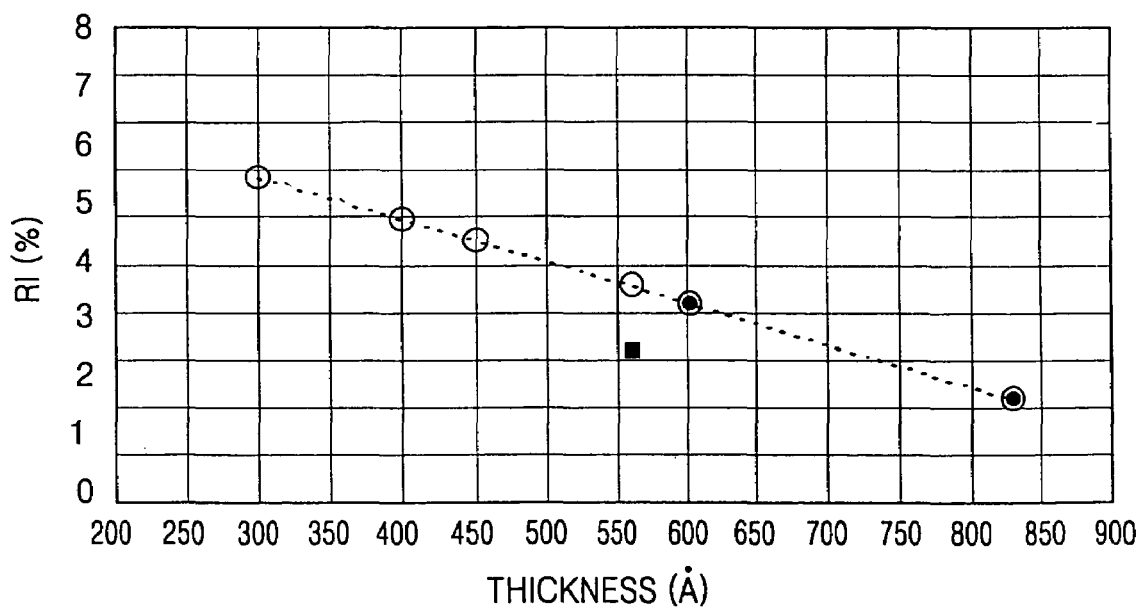
FIG. 7 is a graph showing the reflective index (RI) of the tungsten layer with respect to the thickness of the tungsten layer formed according to the first embodiment of the present invention.

FIG. 7 is a graph showing the reflective index (RI) of the tungsten layer with respect to the thickness of the tungsten layer formed according to the first embodiment of the present invention. In the graph of FIG. 7, a symbol "o" represents the RI of the tungsten layer according to this embodiment and a symbol "■" represents the RI of a tungsten layer according to prior art. Referring to FIG. 7, when the thickness of the tungsten layer is approximately 550 Å, the RI of the tungsten layer according to this embodiment is about 74%, while the RI of the tungsten layer according to prior art is about 66%. As described above, since the tungsten layer according to this embodiment has a relatively large grain size, the RI of the tungsten layer increases. Here, an RI is a variant that is used to estimate the grain size. It can be estimated that the grain size increases as the RI increases.

Also, experimental results show a distinct difference in the resistivity of the tungsten layers. In other words, when the thickness of the tungsten layer according to this embodiment is approximately 603 Å, it has a resistivity of 13.01 μΩ·cm$^2$. In contrast, when the thickness of the tungsten layer according to prior art is approximately 560 Å, it has a resistivity of 17.38 μΩ·cm$^2$.

Figure 8:
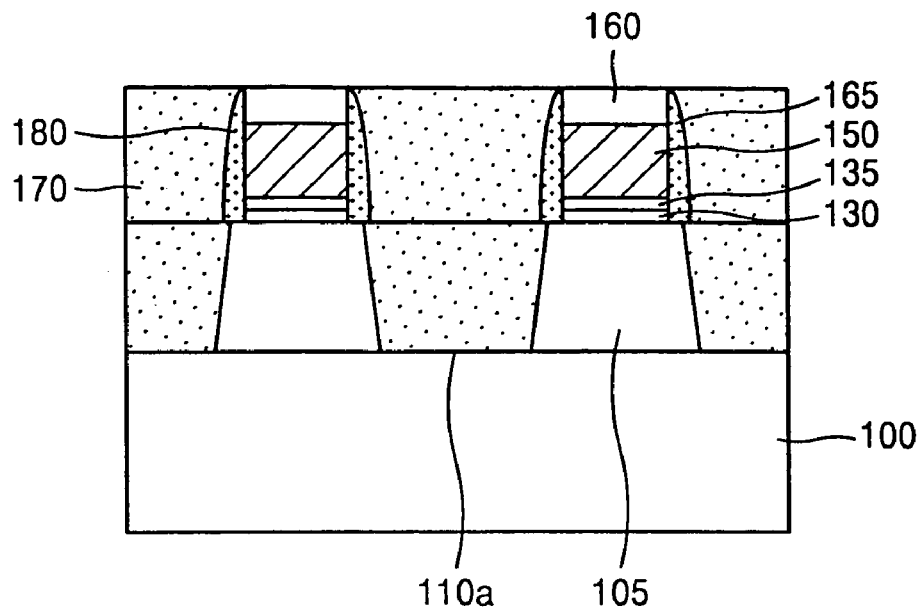
FIG. 8 is a cross-sectional view explaining a bit line loading capacitance between a bit line and a storage node contact plug.

According to this embodiment, by growing the tungsten layer on the grain control layer 135 having a smooth surface, it is possible to increase the grain size of the tungsten layer. Subsequently, the resistance of the tungsten layer decreases and the thickness of the tungsten layer decreases, resulting in a decrease in a bit line loading capacitance. Below are details on the above description with reference to FIG. 8. The bit line 150 is surrounded by an insulating layer 160 formed on the top surface of the bit line 150 and an insulating layer 165 formed at both sides of the bit line 150. A storage node contact plug 170 that contacts a contact pad 110a electrically connected to a source is formed between bit lines 150. The bit line 150 and the storage node contact plug 170 overlap. The insulating layer 165 is interposed between the bit line 150 and the storage node contact plug 170. As a result, a parasitic capacitance is generated. According to this embodiment, by interposing the grain control layer 135 having a smooth surface under the bit line (a tungsten layer) 150, the thickness of the bit line 150 was reduced without an increase in the resistance of the bit line 150. The overlapping area between the bit line 150 and the storage node contact plug 170 was reduced. As a result, the bit line loading capacitance is reduced.

Also, since the grain control layer that is in an amorphous state is further formed on the barrier metal layer 130, it is possible to more efficiently prevent impurities from being diffused. In other words, impurities and moisture of a tungsten layer (the bit line 150) are transferred to a lower layer, i.e., a MOS transistor, along a grain boundary of the barrier metal layer 130. In this embodiment, since the grain control layer 135 in the amorphous state that has no grain boundary is interposed between the tungsten layer (the bit line 150) and the barrier metal layer 130, it is possible to prevent impurities and moisture from being diffused. Accordingly, the diffusion barrier characteristic of the barrier metal layer 130 are improved.

Hereinafter, a second embodiment of the present invention will be described. The second embodiment is the same as the first embodiment until the barrier metal layer 130 is formed. Therefore, the second embodiment will be described in relation to a process following formation of the barrier metal layer 130.

Figure 9:
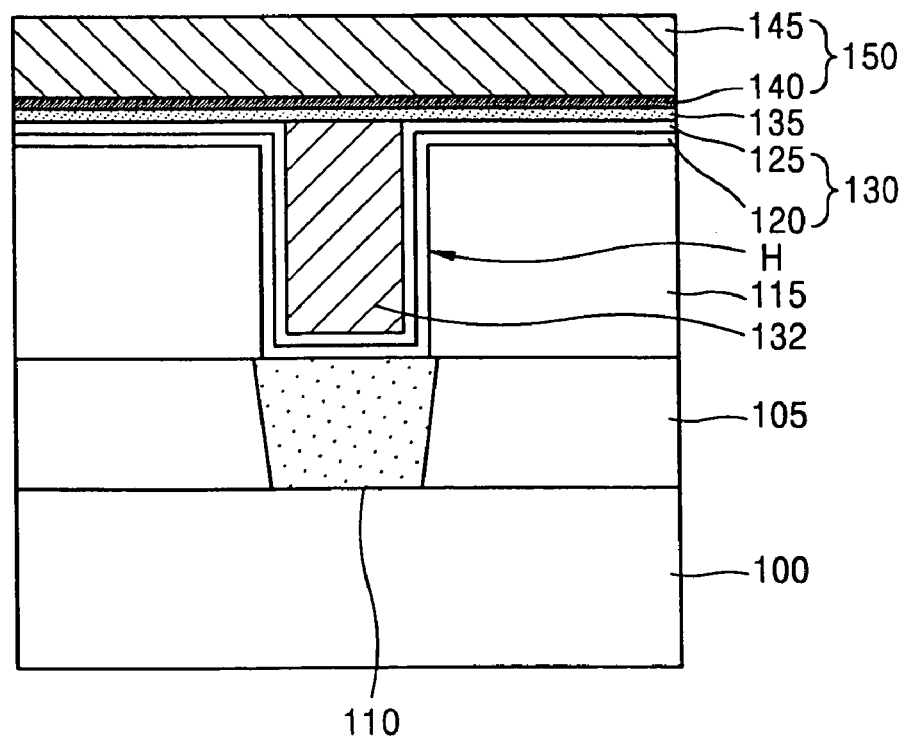
FIG. 9 is a cross-sectional view explaining a method of manufacturing a tungsten bit line, according to a second embodiment of the present invention.

As shown in FIG. 9, to fill in the contact hole H, a conductive layer, e.g., a tungsten layer is deposited on the barrier metal layer 130. To expose the surface of the barrier metal layer 130, a chemical mechanical polarization (CMP) process or an etch-back process on the tungsten layer. As a result, a conductive plug 132 is formed.

A grain control layer 135 having a smooth surface is formed on the barrier metal layer 130 and on the conductive plug 132. The grain control layer 135 may be an amorphous conductive layer as described above or, for example, a TiN layer, a TaN layer, a WN layer, or a NbN layer that is formed using MOCVD. Also, the grain control layer 135 may be formed in the same method as the first embodiment.

A thin silicon sacrificial layer (not shown) having a thickness of several Å is deposited on the grain control layer 135. A nucleation layer 140 is deposited on the silicon sacrificial layer in the same manner as the first embodiment. After that, a bulk tungsten layer 145 is deposited on the nucleation layer 140 using the nucleation layer 140 as seeds. The nucleation layer 140 is formed to have a relatively large grain size by the grain control layer 135 having a smooth surface. The bulk tungsten layer 145 is also formed to have a large grain size by the nucleation layer 140. Then, predetermined portions of the bulk tungsten layer 145 and the nucleation layer 140 are patterned. As a result, a bit line 150 is formed.

As such, when the conductive plug 132 is additionally formed, the same effects as those of the first embodiment can be obtained from this embodiment.

Hereinafter, a third embodiment of the present invention will be described with reference to FIG. 10. The third embodiment is the same as the first embodiment until the contact hole H is formed. Therefore, the third embodiment will be described in relation to a process following formation of the contact hole H.

Figure 10:
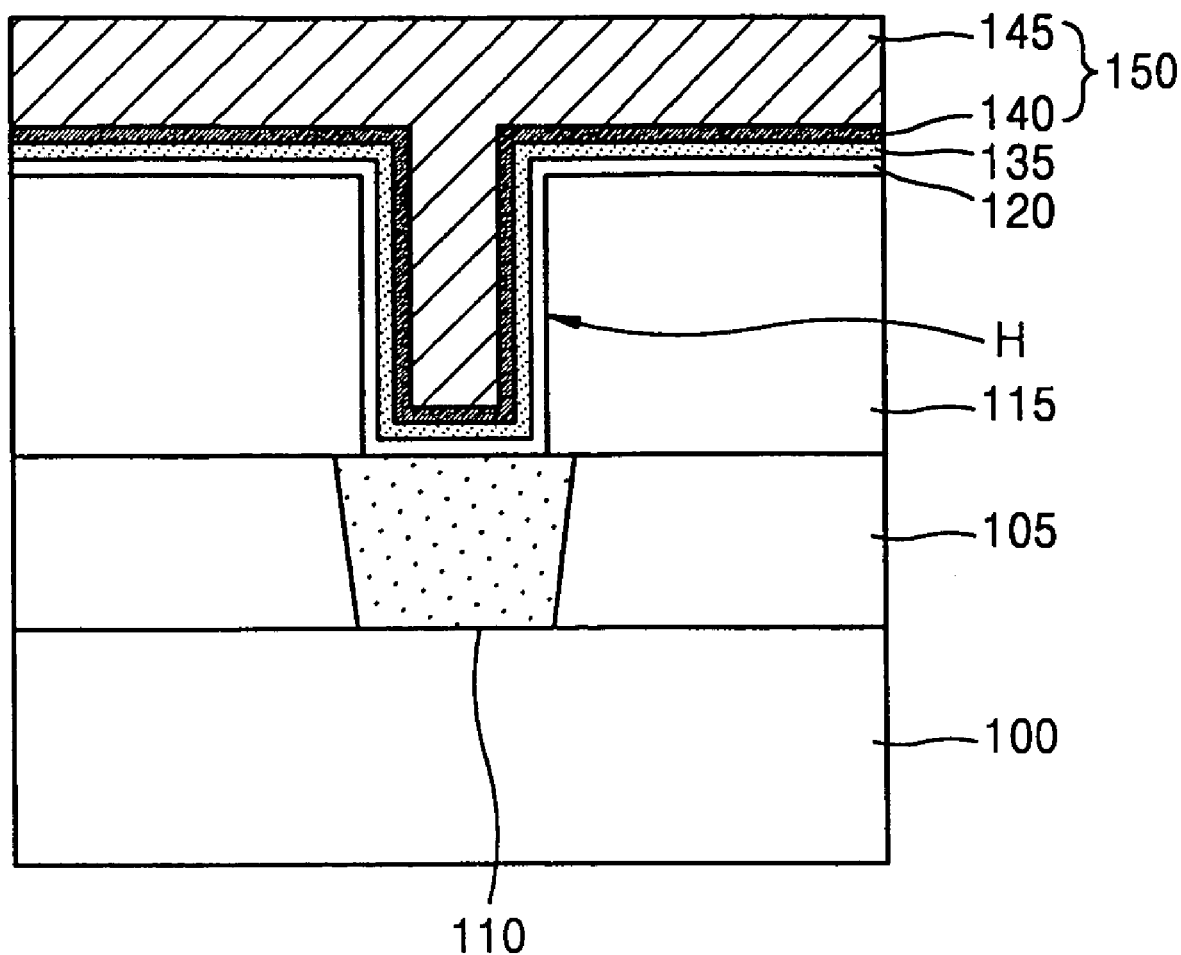
FIG. 10 is a cross-sectional view explaining a method of manufacturing a tungsten bit line, according to a third embodiment of the present invention.

As shown in FIG. 10, a Ti layer 120 as a barrier metal layer is formed on the contact hole H and the second interlayer insulating layer 115, using known CVD, and then the grain control layer 135 is formed on the Ti layer 120. An amorphous conductive layer, e.g., a TiN layer formed using MOCVD may be used as the grain control layer 135. The grain control layer 135 controls a grain of a tungsten layer that is to be formed later. At the same time, the grain control layer 135 serves as a barrier metal layer 130a along with the Ti layer 120. Since the grain control layer 135 is formed to be in the amorphous state as described above, its surface is smooth.

A silicon sacrificial layer (not shown) and the nucleation layer 140 are formed on the barrier metal layer 130a, especially, on the grain control layer 135 formed of TiN using MOCVD. The nucleation layer 140 is formed to have a relatively large grain by the grain control layer 135 having a smooth surface. The bulk tungsten layer 145 is deposited on the nucleation layer 140 using the nucleation layer 140 as seeds, in the same manner as the first embodiment. After that, the bulk tungsten layer 145 and the nucleation layer 140 are patterned. As a result, the bit line 150 is formed.

In this embodiment, a grain control layer is formed instead of a TiN layer that is formed using CVD and constitutes a barrier metal layer. The diffusion barrier characteristic of the barrier metal layer in this embodiment is somewhat inferior to that of the first embodiment. However, since a low-resistance tungsten layer is formed, some of the same effects as those of the first embodiment can be obtained from this embodiment.

The present invention is not limited to forming bit lines, but is also applicable to other structures that include a low-resistance tungsten layer.

As described above, according to embodiments of the present invention, to increase a grain size of a tungsten metal layer, for example, an amorphous conductive layer having a smooth surface is interposed between a barrier metal layer and the tungsten metal layer used for a bit line.

Since both a nucleation layer of the tungsten metal layer and a bulk tungsten layer formed using the nucleation layer as seeds are formed to have large grain sizes by interposing the amorphous conductive layer having a smooth surface, the resistance of the bulk tungsten layer can be reduced. Thus, although the thickness of the bulk tungsten layer used for the bit line is reduced, an increase in the resistance of the bulk tungsten layer can be prevented. Subsequently, it is possible to reduce an overlapping area between the bit line and a storage node contact plug that is to be formed later. Thus, a bit line loading capacitance is reduced and a sensing characteristic of a memory device can be improved.

According to one aspect of the present invention, there is provided a semiconductor memory device comprising a semiconductor substrate, an insulating layer, a barrier metal layer, and an amorphous conductive layer. The semiconductor substrate has a conductive region. The insulating layer is formed on the semiconductor substrate and includes a contact hole that exposes the conductive region. The barrier metal layer is formed on the surface of the insulating layer and on the surface of the contact hole. The amorphous conductive layer is formed on the surface of the barrier metal layer. The tungsten nucleation layer is formed on the amorphous conductive layer. The bulk tungsten layer is formed using the tungsten nucleation layer as seeds. The barrier metal layer is a Ti/TiN layer or a Ti layer.

According to still another aspect of the present invention, there is provided a method of manufacturing a semiconductor memory device, the method comprising forming an insulating layer having a contact hole that exposes a conductive region, on a semiconductor substrate having the conductive region, forming a barrier metal layer along the surface of the insulating layer and the surface of the contact hole, forming a grain control layer on the barrier metal layer, and forming a tungsten layer on the grain control layer. A grain size of the tungsten layer is controlled by the grain control layer.

According to yet another aspect of the present invention, there is provided a method of manufacturing a semiconductor memory device, the method comprising forming an insulating layer having a contact hole that exposes a conductive are, on a semiconductor substrate having the conductive region, forming a barrier metal layer along the surface of the insulating layer and the surface of the contact hole, forming an amorphous conductive layer on the barrier metal layer, forming a nucleation layer on the amorphous conductive layer, and forming a bulk tungsten layer on the nucleation layer by using the nucleation layer as seeds.

According to yet another aspect of the present invention, there is provided a method of manufacturing a semiconductor memory device, the method comprising an insulating layer having a contact hole that exposes a conductive are, on a semiconductor substrate having the conductive region, forming a barrier metal layer along the surface of the insulating layer and the surface of the contact hole, forming an amorphous conductive layer on the barrier metal layer using MOCVD, forming a nucleation layer on the amorphous conductive layer, forming a bulk tungsten layer on the nucleation layer by using the nucleation layer as seeds, and patterning predetermined parts of the bulk tungsten layer the nucleation layer to form a bit line. The amorphous conductive layer may be one of an amorphous TiN layer, an amorphous TaN layer, an amorphous WN layer, and an amorphous NbN layer.

The depositing of the barrier metal layer comprises depositing a Ti layer on the surface of the insulating layer and on the surface of the contact hole and depositing a TiN layer on the Ti layer. The Ti layer and the TiN layer may be formed using chemical vapor deposition (CVD) or may be formed in-situ. The barrier metal layer may be formed of Ti.

The forming of the amorphous conductive layer using MOCVD comprises depositing a first layer of the amorphous conductive layer by using an organic metal source including carbon elements, removing carbon elements from the first layer of the amorphous conductive layer, depositing a second layer of the amorphous conductive layer on the first layer of the amorphous conductive layer by using the organic metal source including carbon elements, and removing carbon elements from the second part of the amorphous conductive layer. Between the forming of the amorphous conductive layer and the forming of the nucleation layer, the method further comprises forming a silicon sacrificial layer on the amorphous conductive layer. The silicon sacrificial layer is naturally removed when the nucleation layer and the bulk tungsten layer are formed.

The nucleation layer is formed by supplying a $WF_6$ gas and a $H_2$ gas at a temperature of about 300-500° C., using CVD. The bulk tungsten layer is formed by supplying a $WF_6$ gas and a $H_2$ gas at a temperature of about 300-500° C., using CVD.

While the present invention has been particularly shown and described with reference to exemplary embodiments thereof, it will be understood by those of ordinary skill in the art that various changes in form and details may be made therein without departing from the spirit and scope of the invention as defined by the appended claims and their equivalents.

What is claimed is:

1. A semiconductor memory device comprising:
    a semiconductor substrate which has a conductive region;
    an insulating layer on the semiconductor substrate; and
    an interlayer insulating film on the insulating layer, the interlayer insulating film having a contact hole that exposes the conductive region;
    a bit line on an upper surface of the insulating layer and electrically connected to the conductive region, the bit line comprising:
        a barrier metal layer on the upper surface of the insulating layer;
        an amorphous conductive layer on the surface of the barrier metal layer;
        a tungsten nucleation layer on the amorphous conductive layer; and
        a bulk tungsten layer on the tungsten nucleation layer; and
    a contact plug within the contact hole, the barrier metal layer being on a surface of the contact hole, the contact plug being between the barrier metal layer on the surface of the contact hole and the amorphous conductive layer.

2. The semiconductor memory device of claim 1, wherein the barrier metal layer is a Ti/TiN layer.

3. The semiconductor memory device of claim 1, wherein the barrier metal layer is a Ti layer.

4. The semiconductor memory device of claim 1, wherein the amorphous conductive layer is one of an amorphous TiN layer, an amorphous TaN layer, an amorphous WN layer, and an amorphous NbN layer.

5. The semiconductor memory device of claim 1, wherein the amorphous conductive layer has a thickness of about 50-200 Å.

6. The semiconductor memory device of claim 1, wherein the nucleation layer has a thickness of about 100-200 Å.

7. The semiconductor memory device of claim 1, wherein the bulk tungsten layer has a thickness of about 400-500 Å.

8. The semiconductor memory device of claim 1, wherein the amorphous conductive layer is directly on the barrier metal layer.

9. The semiconductor memory device of claim 8, wherein:
    the tungsten nucleation layer is directly on the amorphous conductive layer; and
    the bulk tungsten layer is directly on the tungsten nucleation layer.

10. The semiconductor memory device of claim 1, wherein a surface roughness of the amorphous conductive layer is lower than a surface roughness of the barrier metal layer.

11. The semiconductor memory device of claim 1, further comprising:
    an insulating layer formed on a top surface of the bit line; and
    insulating spacers formed at sides of the bit line.

12. A semiconductor memory device comprising:
    a semiconductor substrate which has a conductive region;
    an insulating layer on the semiconductor substrate, the insulating layer including a contact hole that exposes the conductive region;
    a barrier metal layer on the surface of the insulating layer and on the surface of the contact hole;
    an amorphous conductive layer on the surface of the barrier metal layer;
    a contact plug within the contact hole, the contact plug being between the barrier metal layer and the amorphous conductive layer; and
    a bit line on the amorphous conductive layer, the bit line including a tungsten nucleation layer and a bulk tungsten layer on the tungsten nucleation layer,
    wherein the amorphous conductive layer is one of: an amorphous TiN layer, an amorphous TaN layer, an amorphous WN layer, and an amorphous NbN layer.

13. The semiconductor memory device of claim 12, wherein the barrier metal layer is a Ti/TiN layer.

14. The semiconductor memory device of claim 12, wherein the barrier metal layer is a Ti layer.

15. The semiconductor memory device of claim 12, wherein the amorphous conductive layer has a thickness of about 50-200 Å.

16. The semiconductor memory device of claim 12, wherein the nucleation layer has a thickness of about 100-200 Å.

17. The semiconductor memory device of claim 12, wherein the bulk tungsten layer has a thickness of about 400-500 Å.

18. The semiconductor memory device of claim 12, wherein the amorphous conductive layer is directly on the surface of the barrier metal layer.

19. The semiconductor memory device of claim 18, wherein:
    the tungsten nucleation layer is directly on the amorphous conductive layer; and
    the bulk tungsten layer is directly on the tungsten nucleation layer.

20. The semiconductor memory device of claim 12, wherein a surface roughness of the amorphous conductive layer is lower than a surface roughness of the barrier metal layer.

21. The semiconductor memory device of claim 12, further comprising:
    an insulating layer formed on a top surface of the bit line; and
    insulating spacers formed at sides of the bit line.

22. A semiconductor device comprising:
    a semiconductor substrate having a conductive region;
    an insulating layer on the semiconductor substrate, the insulating layer having a contact hole exposing the conductive region;
    a barrier metal layer on the insulating layer and within the contact hole;
    a grain control layer directly on the barrier metal layer and extending over an upper surface of the insulating layer;
    a contact plug within the contact hole, the contact plug being between the barrier metal layer and the grain control layer;
    a tungsten nucleation layer directly on the grain control layer; and
    a bulk tungsten layer directly on the tungsten nucleation layer, the bulk tungsten layer in electrical communication with the conductive region and extending over the upper surface of the insulating layer.

23. The semiconductor device of claim 22, wherein the grain control layer is within the contact hole.

24. The semiconductor device of claim 22, wherein the barrier metal layer is a Ti/TiN layer.

25. The semiconductor device of claim 22, wherein the barrier metal layer is a Ti layer.

26. The semiconductor device of claim 22, wherein a surface roughness of the grain control layer is lower than a surface roughness of the barrier metal layer.

27. The semiconductor device of claim 22, wherein the grain control layer is amorphous.

* * * * *